(12) United States Patent
Burt

(10) Patent No.: US 6,781,463 B2
(45) Date of Patent: Aug. 24, 2004

(54) LOW VOLTAGE AMPLIFIER

(75) Inventor: Rodney T. Burt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/334,614

(22) Filed: Dec. 31, 2002

(65) Prior Publication Data

US 2004/0124921 A1 Jul. 1, 2004

(51) Int. Cl.[7] .............................................. H03F 3/45
(52) U.S. Cl. ..................................... 330/255; 330/253
(58) Field of Search ................................ 330/255, 261, 330/253, 257

(56) References Cited

U.S. PATENT DOCUMENTS

| 4,570,128 A | | 2/1986 | Monticelli | |
|---|---|---|---|---|
| 5,565,815 A | * | 10/1996 | Klein | 330/253 |
| 6,150,883 A | * | 11/2000 | Ivanov | 330/253 |
| 6,624,696 B1 | * | 9/2003 | Eschauzier et al. | 330/255 |

OTHER PUBLICATIONS

Huijsing, Johan H., "Operational Amplifiers Theory And Design," 2001, pp 322–324, "Compact 1.2 Volt R–R–out CMOS class–AB OpAmp with MC," Drawing Figs. 7.7.7 and 5.4.13.

* cited by examiner

Primary Examiner—Henry Choe
(74) Attorney, Agent, or Firm—W. Daniel Swayze, Jr.; W. James Brady; Frederick J. Telecky, Jr.

(57) ABSTRACT

An operational amplifier is configured for low voltage operation and better compliance. An exemplary operational amplifier comprises a folded-cascode amplifier with a class-AB biased output stage configured for low voltage operation. The exemplary output stage includes a class-AB control loop being controlled for the upper output device, and with the complementary, lower output device being driven through an additional gain configuration to allow for the necessary compliance voltage. In addition, the lower output device can be configured to operate with a low gate-source voltage.

20 Claims, 5 Drawing Sheets

LOW VOLTAGE AMPLIFIER

FIELD OF INVENTION

The present invention relates to amplifiers. More particularly, the present invention relates to a low voltage amplifier.

BACKGROUND OF THE INVENTION

The demand for improved operational amplifiers, and in particular low power, operational amplifier circuits for high-precision data acquisition and instrumentation applications, such as multi-channel data acquisition systems, audio processing, test equipment and other consumer electronics applications continues to increase. Such operational amplifier circuits generally include an input stage circuit and an output stage circuit comprised of various amplifier devices and other current sources.

The input stage of many operational amplifier circuits, for example one comprising a differential pair arrangement of transistors, is configured for sensing a differential input voltage, which may realize inherent errors with offset voltage, bias current, offset voltage drift, and noise. The design of the input stage is typically aimed at minimizing these errors, while maintaining low current consumption, and with a large portion of the rail-to-rail input range being made available for common-mode signals.

Output stages are generally configured to provide a load impedance $Z_L$ with a desired output voltage $V_{OUT}$ and current $I_{OUT}$, resulting in an output power $P_{OUT}=V_{OUT}I_{OUT}$. The typical main requirements of output stages are to provide negative and positive output currents at high current efficiency, an output voltage range that efficiently uses the full rail-to-rail range, i.e., from the negative supply rail to the positive supply rail, low distortion, and good high-frequency performance.

Class-AB biasing is often used to improve performance of output stage devices due to the ability to eliminate cross-over distortion by biasing the output transistors at a small, but finite, current Class-AB biasing is similar to class-A biasing in that the output transistors are maintained "on", and similar to class-B biasing in that the output transistors are biased at a much smaller current than the peak current delivered to the load. Class-AB biasing can be configured with feedforward biasing or with feedback biasing. Feedforward biasing is utilized when the biasing is fixed by components in series or in parallel with the signal path, while in feedback biasing uses a feedback loop to provide the class-AB biasing.

With reference to FIG. 1, an operational amplifier circuit 100 comprising an input stage 102 and an output stage 104 is illustrated as separate stages, which can be directly connected, or coupled through other stages. Such a class-AB configuration is often referred to as direct class-AB biasing.

Input stage 102 comprises a differential pair of transistors $M_1$ and $M_2$. The difference in input current from a source $I_1$, at the sources of transistors $M_1$ and $M_2$ is derived at the drains as signal currents, $SIGNAL_1$, and $SIGNAL_2$. Difference currents $SIGNAL_1$, and $SIGNAL_2$ can be fed into multiple stage applications with appropriate level shifting, e.g., folded cascode or other stage applications, such as output stage 104.

Output stage 104 comprises a class-AB biasing configuration including biasing transistors $B_1$-$B_4$, a pair of complementary signal devices $M_3$ and $M_4$, and a pair of output devices, $M_5$ and $M_6$. Output stage 104 is configured to source current in output device $M_5$ and to sink current through output device $M_6$. It is desirable for output stage 104 to be able to fully swing from the positive rail to the negative rail, i.e., from $V_S^+$ to ground. This generally requires output devices $M_5$ and $M_6$ to be driven as common source devices. As common source devices, it is difficult to provide biasing when no current is flowing through output devices $M_5$ and $M_6$. Further, when there is little or no output current at zero load, output devices $M_5$ and $M_6$ must still maintain a low dynamic output impedance. Without class-AB biasing, the output current could not go to zero, or the output impedance would be extremely high. However, the class-AB biasing configuration facilitates zero current under a zero load condition.

For example, biasing transistors $B_1$ and $B_2$ are connected in series and configured with a controlled current source $I_2$ to supply two gate-source voltages $V_{GS}$ to the gate of transistor $M_3$. Transistor $M_3$ comprises a source follower that supplies current to the gate of transistor $M_5$, thus providing a first, upper controlled $V_{GS}$ loop, with the gate-source voltages $V_{GS}$ of biasing transistors $B_1$ and $B_2$ equaling the gate-source voltages VGS of transistors $M_3$ and $M_5$. The current flow within the upper $V_{GS}$ loop is defined by the areas and current flow within the devices. A current source $I_4$ is configured to provide a controlled current through transistor $M_3$. Thus with controlled current provided through biasing transistors $B_1$ and $B_2$ and transistor $M_3$, the current flow in transistor $M_5$ can be substantially controlled. Similarly, a second, lower controlled $V_{GS}$ loop is provided with biasing transistors $B_3$ and $B_4$, transistor $M_4$, and a controlled current source $I_5$ to control the nominal current flow in transistor $M_6$.

During operation, when transistor $M_5$ sources (or supplies) more current, the gate-source voltage $V_{GS}$ of transistor $M_5$ increases; since the gate of transistor $M_3$ is constant, the gate-source voltage $V_{GS}$ of transistor $M_3$ must decrease, resulting in less current flow through transistor $M_3$. Therefore, some of the current supplied to a node 106 must be diverted instead to transistor $M_4$, resulting in the gate-source voltage $V_{GS}$ of transistor $M_4$ getting larger, thus decreasing or cutting off the gate-source voltage $V_{GS}$ of transistor $M_6$, i.e., as transistor $M_5$ sources more current, transistor $M_6$ is cut off. Conversely, as transistor $M_6$ sinks (or requires) more current, transistor $M_5$ is cut off. For no load current, half of the current into node 106 flows through transistor $M_3$ and the other half through the drain of transistor $M_4$ to supply bottom current source 15, resulting in nominal biasing of output devices $M_5$ and $M_6$, i.e., a quiescent current condition with zero load current.

Unfortunately, for the upper and lower loops of output stage 104 to effectively bias the gates of transistors $M_3$ and $M_4$ at least two gate-source voltage $V_{GS}$ are needed. For typical CMOS processes, this two gate-source voltage $V_{GS}$ condition requires at least two volts or more, which is significantly higher than the low voltage operation, e.g., 1.8 volt or less, that is being demanded in current applications.

SUMMARY OF THE INVENTION

In accordance with various aspects of the present invention, an operational amplifier is configured for low voltage operation and better compliance. In accordance with an exemplary embodiment, an operational amplifier comprises a folded-cascode amplifier with a class-AB biased output stage configured for low voltage operation. The exemplary output stage includes a class-AB control loop being controlled for the upper output device, and with the complementary, lower output device being configured with an additional gain arrangement to allow for the necessary compliance voltage. The lower output device is configured to operate with a low gate-source voltage without significantly affecting the load impedance seen by a difference current received from an input stage. This configuration significantly increases the gain of the operational amplifier.

In accordance with an exemplary embodiment, the upper devices of the output stage can be configured with a cascoded mirror and a class-AB control loop driven by a charge pump to meet and/or exceed compliance voltage requirements for the upper devices.

BRIEF DESCRIPTION OF THE DRAWING

A more complete understanding of the present invention may be derived by referring to the detailed description and claims when considered in connection with the figures, where like reference numbers refer to similar elements throughout the figures, and:

DETAILED DESCRIPTION OF EXEMPLARY EMBODIMENTS OF THE INVENTION

The present invention may be described herein in terms of various functional components. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with a low voltage amplifier application. Further, it should be noted that while various components may be suitably coupled or connected to other components within exemplary circuits, such connections and couplings can be realized by direct connection between components, or by connection through other components and devices located thereinbetween.

Maintaining a large saturation voltage $V_{DSAT}$ for folded-cascode loads is required for best noise and offset performance. Unfortunately, prior methods of "direct" class AB biasing are impractical for low voltage operation. However, in accordance with various aspects of the present invention, an operational amplifier is configured for low voltage operation and better compliance, i.e., with higher drain-saturated voltages $V_{DSAT}$ being attainable.

In accordance with an exemplary embodiment, an operational amplifier comprises a folded-cascode amplifier having a class-AB biased output stage configured for low voltage operation. The exemplary output stage includes a class-AB control loop being controlled for the upper output device, and with the complementary, lower output device being configured with an additional gain arrangement to allow for the necessary compliance voltage. In other words, only an upper class-AB loop is controlled, with a reduced gate-source voltage $V_{GS}$ required for the lower output device, and thus permitting lower voltage operation.

Figure 1:
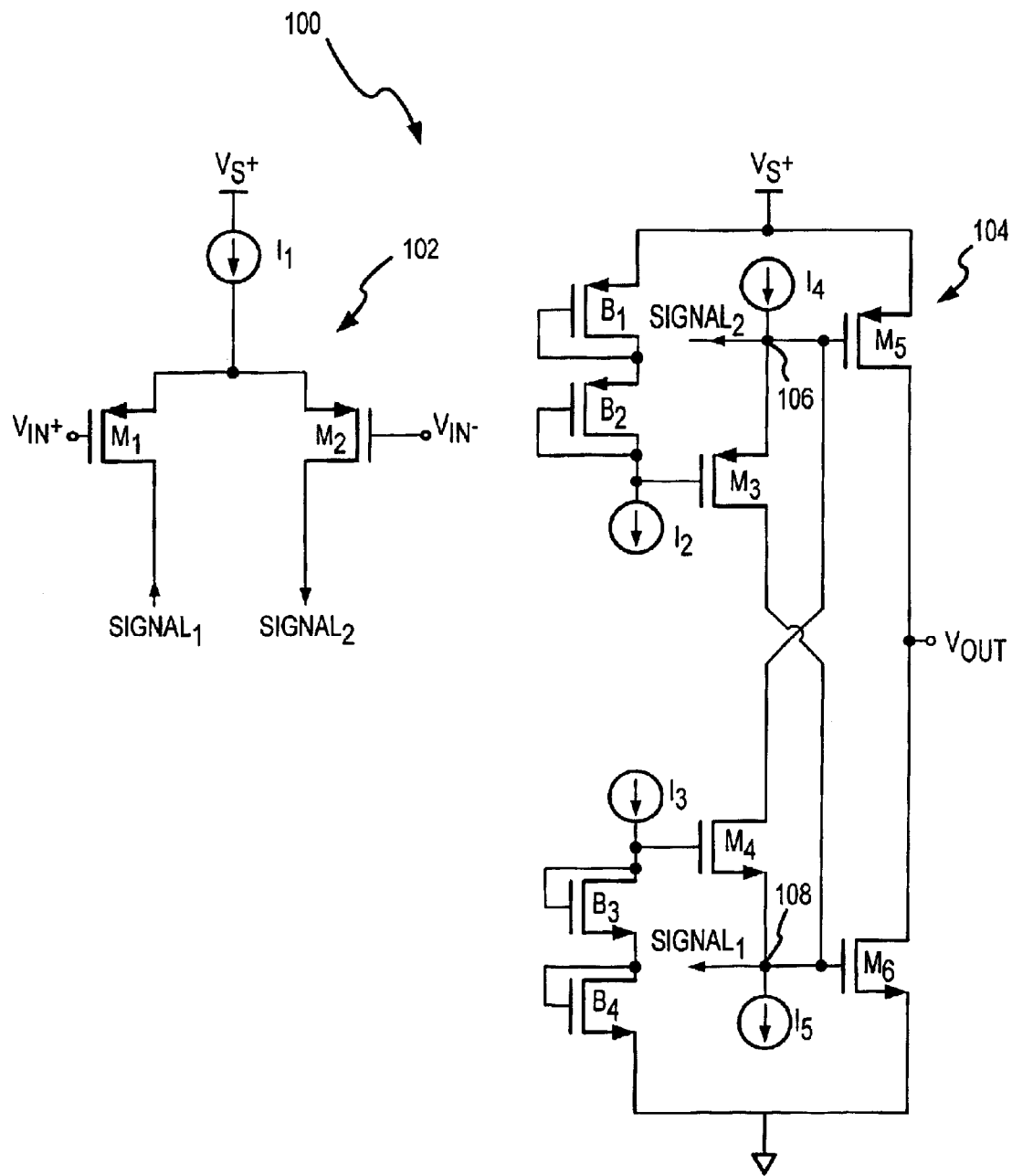
FIG. 1 illustrates a schematic diagram of a prior art operational amplifier circuit.
Figure 2:
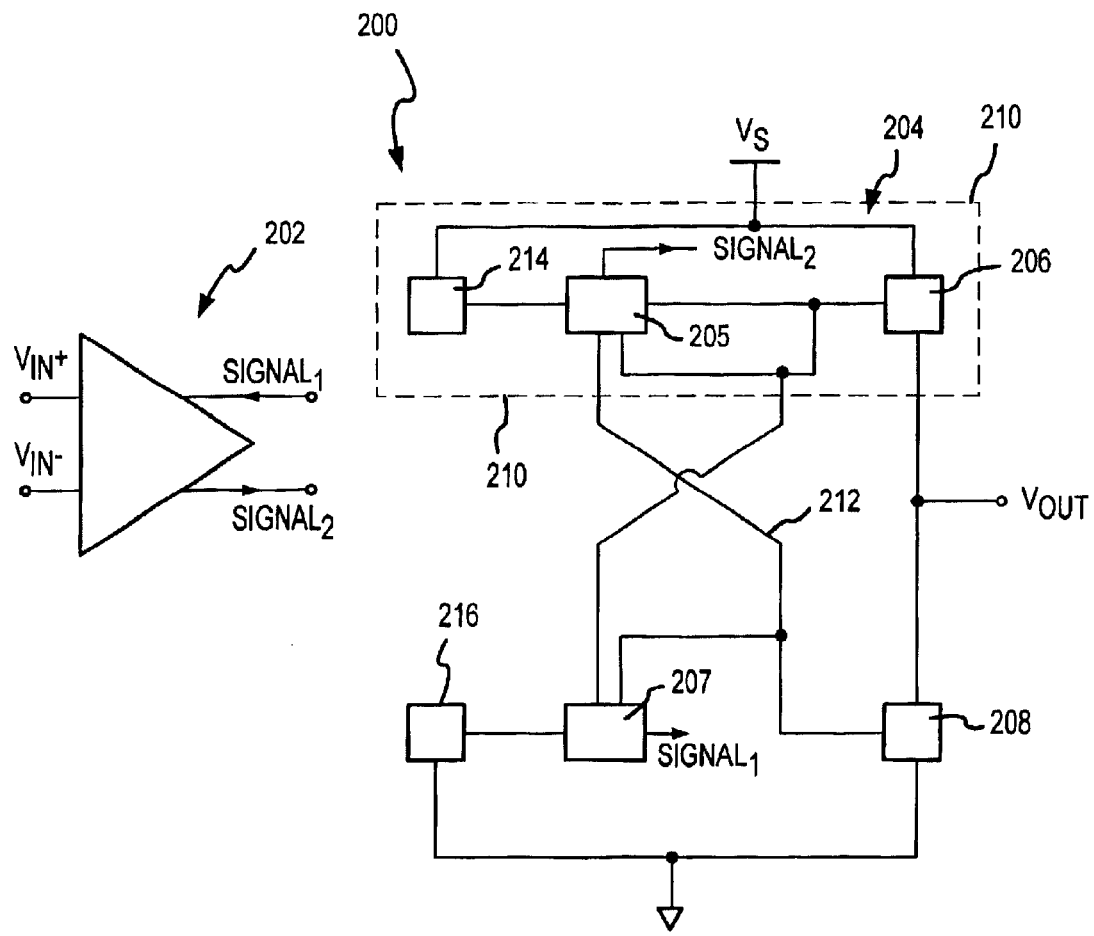
FIG. 2 illustrates a block diagram of an exemplary operational amplifier circuit in accordance with an exemplary embodiment of the present invention.
Figure 3A:
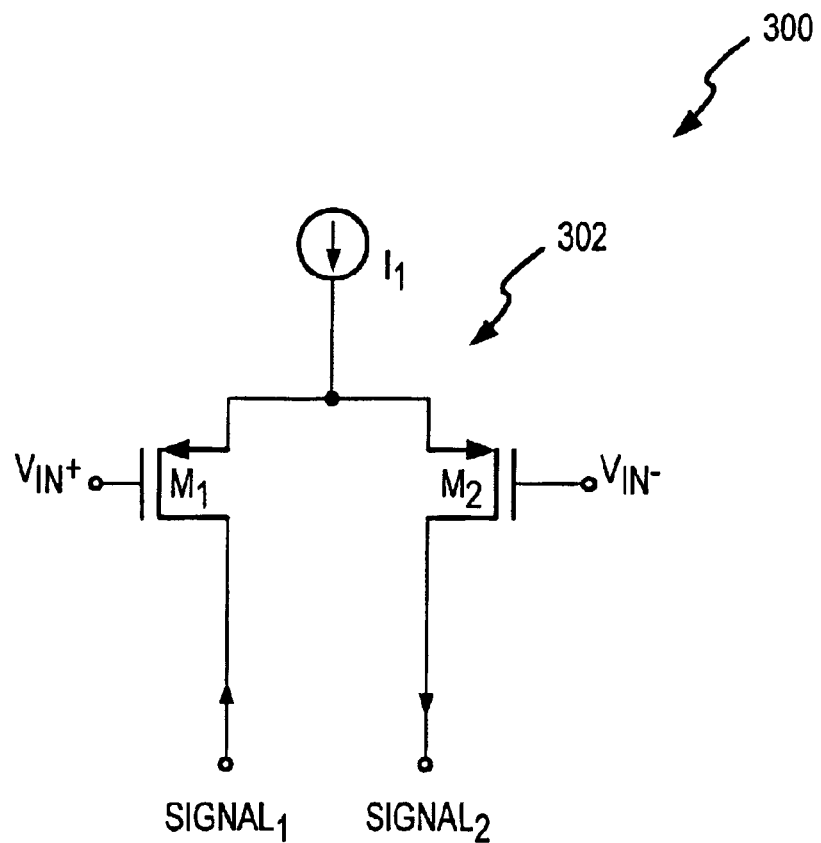
FIG. 3 illustrates a schematic diagram of an exemplary operational amplifier circuit in accordance with an exemplary embodiment of the present invention.
Figure 3C:
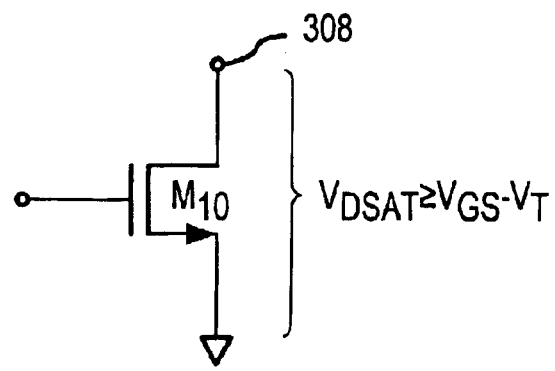
Figure 3B:
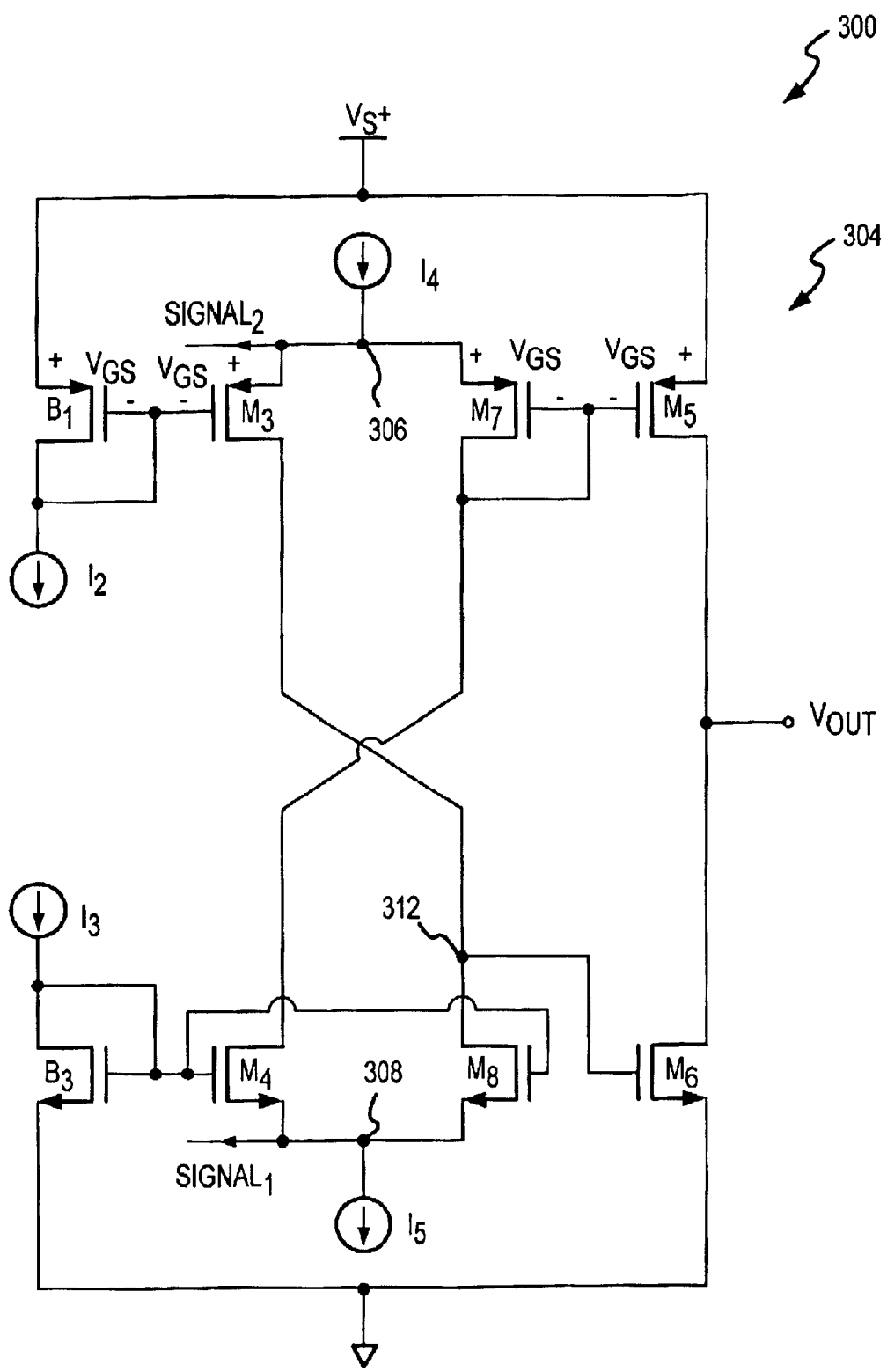

For example, with reference to FIG. 2, a block diagram of an exemplary operational amplifier 200 is illustrated. Operational amplifier 200 comprises a folded-cascode amplifier having an input stage 202 and an output stage 204. Input stage 202 is configured to provide difference current signals, $SIGNAL_1$ and/or $SIGNAL_2$, to output stage 204, either directly, or through one or more stages in between. While input stage 202 can comprise various configurations, in the exemplary embodiments input stage 202 comprises a differential pair of transistors, e.g., FET, bipolar or other transistor-types, configured to receive a differential input voltage, $V_{IN}^+$ and $V_{IN}^-$. For example, with momentary reference to FIG. 3, an input stage 302 can comprise a differential pair of transistors $M_1$ and $M_2$. The difference in input current from a source $I_1$ at the input terminals, e.g., sources, of transistors $M_1$ and $M_2$ is derived at the output terminals, e.g., drains, as signal currents, $SIGNAL_1$ and $SIGNAL_2$. Difference currents $SIGNAL_1$ and/or $SIGNAL_2$ can be fed into multiple stages with appropriate level shifting, e.g., with folded cascode or other stages, or fed directly to output stage 204.

Output stage 204 is configured to provide an output voltage $V_{OUT}$ under low voltage conditions, i.e., at approximately 1.8 volts or less. Output stage 204 comprises a class-AB biased output stage configured for low voltage operation. Output stage 204 includes a pair of input devices 205 and 207 configured to receive at least one of difference currents $SIGNAL_1$ and $SIGNAL_2$ from input stage 202, and configured with biasing devices 214 and 216. Output stage 204 also includes a pair of output devices 206 and 208 configured for sourcing and sinking current to a load. A class-AB control loop 210 comprising devices 214, 205 and 206 is configured for controlling upper output device 206, while complementary, lower output device 208 includes an additional gain configuration comprising a direct signal path to allow for the necessary compliance voltage. For example, lower output device 208 is configured to operate with a low voltage, e.g., a low gate-source voltage, without significantly affecting the load impedance seen by difference current $SIGNAL_1$ due to output stage 204. This configuration significantly increases the gain of operational amplifier 200.

Output stage 204 can be configured in various arrangements. For example, with reference to an exemplary embodiment in FIG. 3, an output stage 304 comprises biasing transistors $B_1$ and $B_3$, signal devices $M_3, M_4, M_7$ and $M_5$, and a pair of complementary output devices $M_5$ and $M_6$. Output stage 304 is configured to allow the sourcing of a large current in output device $M_5$ and to allow the sinking of a large current through output device $M_6$.

Output stage 304 comprises an upper control loop for the upper devices, i.e., a control loop comprising devices $B_1$, $M_3$, $M_7$ and $M_5$, for controlling the signal current through output device $M_5$ to an output terminal $V_{OUT}$. In the exemplary embodiment, the upper control loop comprises a PMOS class-AB control loop. Biasing device $B_1$ comprises a diode-connected transistor configured to provide a gate-source voltage $V_{GS}$ to drive the control terminal, e.g., the gate, of signal device $M_3$, with the drain of biasing device $B_1$ connected to a current source 12. Signal device $M_3$ has a source coupled to a node 306 from which a current source $I_4$ and difference current signal $SIGNAL_2$ are received, and a drain coupled to the drain of lower signal device $M_5$. Signal device $M_7$ comprises a diode-connected transistor having a gate coupled to the gate of upper output device $M_5$, with the source of signal device $M_7$ coupled to a node 306 and a drain coupled to the drain of signal device $M_4$. Output device $M_5$ further comprises a source coupled to an upper rail supply voltage $V_S^+$, and a drain coupled to an output terminal $V_{OUT}$.

To meet and/or exceed compliance voltage requirements for the upper devices, output stage 304 can include a charge pump configured to provide additional voltage beyond upper rail supply $V_S^+$. For example, a charge pump can be coupled to current source $I_4$ that drives signal device $M_7$ and signal device $M_3$, for example by connection to upper rail supply $V_S^+$ or through a current mirror circuit, thus improving compliance for the upper devices.

As for the lower devices, output stage 304 does not include a complementary lower control loop, i.e., a control loop operating the same as the upper class-AB control loop. Instead, output stage 304 is configured with an additional gain arrangement for driving output device $M_6$ such that voltage changes at the gate of output device $M_6$ do not significantly affect the load impedance seen by difference current $SIGNAL_1$ due to output stage 304. As a result, the gain of operational amplifier 300 is significantly increased. In other words, only an upper class-AB loop is controlled, thus permitting lower voltage operation.

Biasing device $B_3$ comprises a diode-connected transistor configured to provide a gate-source voltage $V_{GS}$ to drive the gate of device signal $M_4$, with the drain of biasing device $B_3$ connected to a current source $I_3$. Signal device $M_4$ has a source coupled to a node 308 from which a current source $I_5$ and difference current signal $SIGNAL_1$ are coupled, and a drain coupled to the drain of signal device $M_7$. Signal device $M_8$ has a source coupled to node 308, and thus to current source $I_5$, a drain coupled to the drain of signal device $M_3$, and a gate coupled to the gate of signal device $M_4$. Thus, with their respective sources and gates connected together, signal device $M_4$ and signal device $M_8$ operate as a current splitter configuration for current source $I_5$ and $SIGNAL_1$.

Current source $I_5$ is configured to have increased compliance voltage. For example, with reference to FIG. 3C, a current source comprises a transistor $M_{10}$ having a voltage from a node 308 to ground comprising the compliance voltage, $V_{DSAT}$. For good DC performance and operation at a high impedance condition, it is desirable for the compliance voltage $V_{DSAT}$ to be approximately greater than the gate-source voltage $V_{GS}$ less the transistor threshold voltage $V_T$, i.e., $V_{DSAT} \sim > V_{GS} - V_T$, with a range between, for example, approximately 1 volt to approximately 300 millivolts. Thus, current source $I_5$ is configured to have increased compliance voltage ranging between approximately 1 volt to approximately 300 millivolts.

Output device $M_6$ comprises a large device to facilitate high current flow at output terminal $V_{OUT}$ when large sinking currents are required. However, to facilitate low current flow when the current requirements at output terminal $V_{OUT}$ are low, output device $M_6$ is configured with a lower gate-source voltage $V_{GS}$, for example approximately 600 mV or less. Output device $M_6$ includes a source coupled to ground, and a drain coupled to output terminal $V_{OUT}$. In addition, the gate of output device $M_6$ is coupled in a direct signal path through a node 312 to the drain of signal device $M_3$. As a result, the compliance voltage $V_{DSAT}$ of current source 15 can be increased to approximately 300 mV or more without increasing the voltage at the gate of output device $M_6$.

Moreover, unlike prior art output stage 104, changes in the gate voltage of output device $M_6$ does not detrimentally affect the load impedance seen by difference current $SIGNAL_1$ due to output stage 304. Instead, the gate voltage of output device $M_6$ is controlled by the additional gain configuration comprising a direct signal path from the drain of upper signal device $M_3$. In addition, through the current splitter configuration of signal device $M_4$ and signal device $M_8$, which in effect provide an amplifier function, a high gain can be realized at the gate of output device $M_6$, e.g., in the order of approximately 10× to 100+ or more. Thus, the configuration of the lower devices of output stage 304 facilitates lower voltages, better compliance, and increased gain.

During operation of output stage 304, for output device $M_5$ to source a large current, the gate-source voltage $V_{GS}$ of output device $M_5$ is increased. To increase the gate-source voltage $V_{GS}$ of output device $M_5$, the proportion of current from current source $I_4$ through signal device $M_7$ is increased (to increase the gate-source voltage $V_{GS}$ of transistor $M_7$), and thus the proportion of current from current source $I_4$ through signal device $M_3$ is decreased (to decrease the gate-source voltage $V_{GS}$ of transistor $M_3$). The proportion of current from current source $I_4$ through signal device $M_7$ can be increased by changing the rates of current from current source $I_5$ through signal device $M_4$ and signal device $M_5$, e.g., with more current through signal device $M_4$ and less current through signal device $M_8$. To provide more current through signal device $M_4$ and less current through signal device $M_8$, the voltage at node 312 is suitably reduced, thus decreasing or cutting off the gate-source voltage $V_{GS}$ of output device $M_6$, i.e., as output device $M_5$ sources more current, output device $M_6$ is cut off. On the other hand, as output device $M_6$ sinks a large current, the currents through devices $M_4$, $M_8$, $M_3$ and $M_7$ require substantially less change such that output device $M_5$ is only slightly queued down from a no-load condition.

Thus, for no load current, half of the current into node 306 flows through transistor $M_3$ and the other half through the drain of transistor $M_4$ to supply bottom current source $I_5$, resulting in nominal biasing of output devices $M_5$ and $M_6$, i.e., a quiescent current condition with zero load current. The current in output devices $M_5$ and $M_6$ can be configured at the quiescent current level and provide an appropriate level of current at output terminal $V_{OUT}$ through an external feedback path in operational amplifier 300. The external feedback path can provide for small differences in differential input voltage, $V_{IN}^+$ and $V_{IN}^-$ to provide small differences in currents $SIGNAL_1$ and $SIGNAL_2$.

Figure 4:
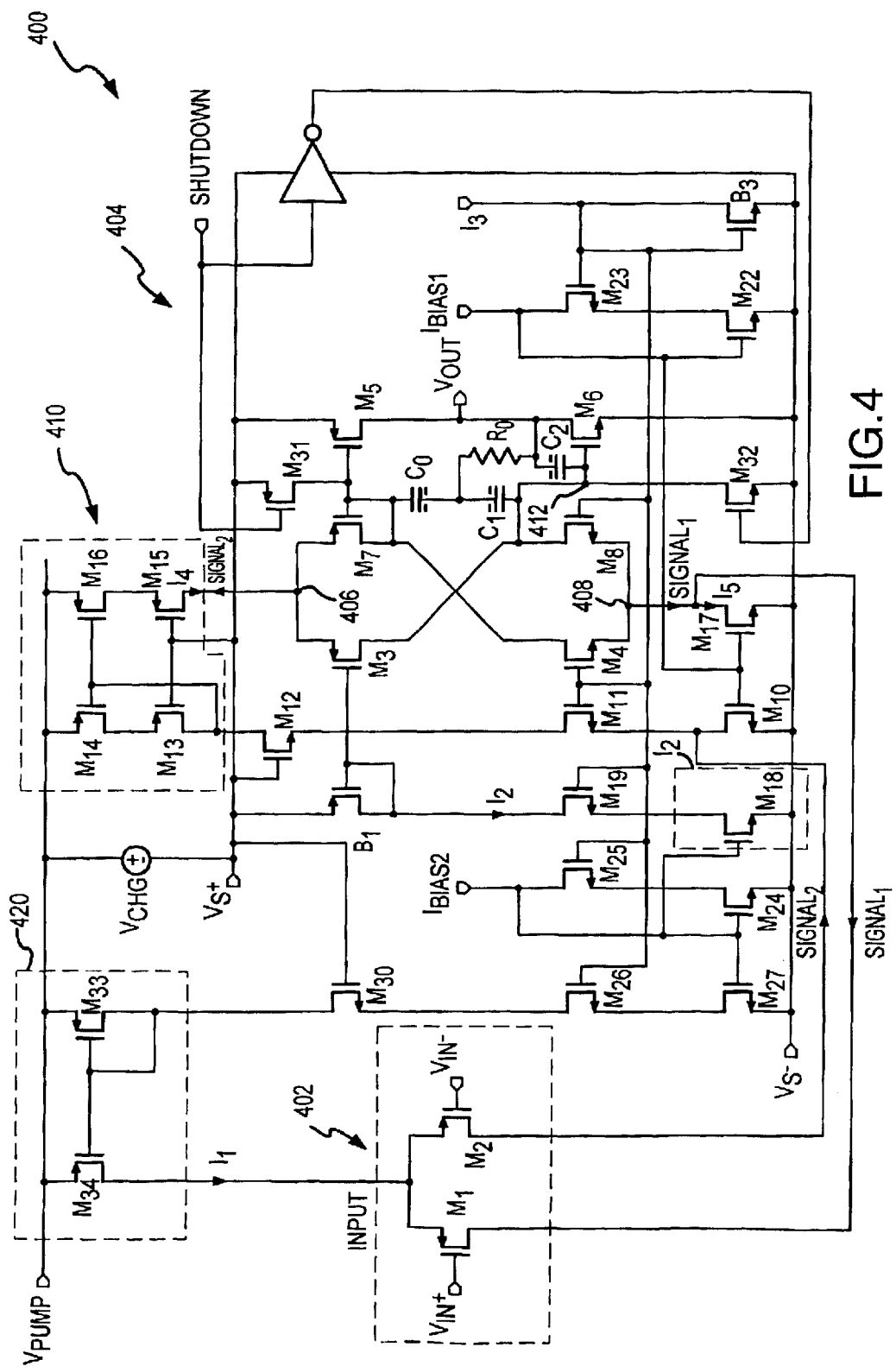
FIG. 4 illustrates a schematic diagram of another exemplary operational amplifier circuit in accordance with an exemplary embodiment of the present invention.

With reference to FIG. 4, a voltage amplifier 400 is illustrated in accordance with another exemplary embodiment of the present invention. Voltage amplifier 400 comprises a folded-cascode amplifier having an input stage 402 and an output stage 404. Input stage 402 comprises a differential input stage configuration including a differential pair of transistors $M_1$ and $M_2$, configured for receiving differential input signals $V_{IN}^+$ and $V_{IN}^-$, respectively. The source terminals of transistors $M_1$ and $M_2$ are controlled by an input current from a current source $I_1$. The difference in input current from current source $I_1$ at the sources of transistors $M_1$ and $M_2$ is derived at their respective drains as signal currents, SIGNAL$_1$ and SIGNAL$_2$. Difference currents SIGNAL$_1$ and SIGNAL$_2$ can be fed into to output stage 404 through various stages or devices with appropriate level shifting.

Current source I$_1$ can be suitably driven by a charge pump at terminal V$_{PUMP}$, e.g., by connection of a source of a transistor M$_{34}$ to terminal V$_{PUMP}$ which is approximately two volts above the upper rail supply, or driven directly by the upper rail supply. However, providing a charge pump, e.g., at approximately two volts above the upper rail supply, can allow input stage 402 to realize full rail-to-rail operation.

Output stage 404 comprises biasing transistors B$_1$ and B$_3$, signal devices M$_3$, M$_4$, M$_7$ and M$_8$ and a pair of complementary output devices M$_5$ and M$_6$. Output stage 404 is configured to allow the sourcing of a large current in upper output device M$_5$ and to allow the sinking of a large current through lower output device M$_6$. Output stage 404 is configured with an additional gain arrangement for driving output device M$_6$ such that a reduced gate-source voltage V$_{GS}$ is needed for lower output device M$_6$, thus allowing low voltage operation of output stage 404.

A PMOS class-AB control loop comprising devices B$_1$, M$_3$, and M$_7$ is provided for controlling the signal current through upper output device M$_5$ to an output terminal V$_{OUT}$, i.e., the gate of output device M$_5$ controlled by the PMOS loop through devices M$_7$ and M$_3$, and diode-connected biasing device B$_1$. The drain of biasing device B$_1$ is connected to a current source I$_2$, comprising a transistor M$_{18}$. A cascode transistor M$_{19}$ coupled to transistor M$_{18}$ can facilitate a high output impedance for current source I$_2$.

Signal devices M$_3$ and M$_7$ have sources coupled to a node 406 from which difference current signal SIGNAL$_2$ is received. Current signal SIGNAL$_2$ is provided through a signal path from the drain of transistor M$_2$, through a folded-cascode stage comprising current source transistor M$_{10}$, and cascoding devices M$_{11}$ and M$_{12}$, and through a current mirror 410 (representative of a current source I$_4$) to node 406. Current mirror 410 comprises a cascoding configuration including transistors M$_{13}$, M$_{14}$, M$_{15}$ and M$_{16}$. In the exemplary embodiment, current mirror 410 is coupled to charge pump terminal V$_{PUMP}$. Current mirror 410 is configured with transistor M$_{14}$ having a gate connected back to the drain of transistor M$_{13}$.

Lower output device M$_6$ is not controlled by a class-AB control loop, but rather is driven by a direct signal path. Output device M$_6$ has a source connected to lower rail supply V$_S^-$, a drain coupled to an output terminal V$_{OUT}$, and a gate coupled to the drain of transistor M$_3$ through a node 412. Lower devices B$_3$, M$_8$ and M$_4$ are configured in a gain configuration to enable output device M$_6$ to have a low gate-source voltage without significantly affecting the load impedance seen by difference current SIGNAL$_1$ due to output stage 404. The gain configuration of lower devices B$_3$, M$_8$ and M$_4$ significantly increases the gain of operational amplifier 400. Biasing device B$_3$ is diode-connected, with the gate-drain connected to the gates of devices M$_8$ and M$_4$. The gate-drain of biasing device B$_3$ is further connected to a current source I$_3$. Signal device M$_4$ and device M$_8$ have sources coupled to a node 408 from which difference current signal SIGNAL$_1$ is received. Current signal SIGNAL$_1$ is provided through a signal path from the drain of transistor M$_1$, to the drain of a transistor M$_{17}$ (representative of a current source I$_5$).

Output stage 404 can also comprise various other devices for biasing, cascoding and for shutting down. For example, a first biasing circuit comprising transistors M$_{22}$ and M$_{23}$ coupled to bias terminal I$_{BIAS1}$ is provided for generation of current sources I$_4$ and I$_5$, while a second biasing circuit comprising transistors M$_{24}$, M$_{25}$, M$_{26}$, M$_{27}$, and M$_{30}$ coupled to bias terminal I$_{BIAS2}$ is provided for generation of current sources I$_1$ and I$_2$. To provide current source I$_1$, a current mirror 420 comprising transistors M$_{33}$ and M$_{34}$ can also be provided to mirror current from the second biasing circuit. In various embodiments, a shutdown circuit can also be included, for example, with the shutdown circuit comprising transistors M$_{31}$ and M$_{32}$ coupled to a signal SHUTDOWN.

Compensation for operational amplifier 400 can be provided through compensation capacitors C$_0$, C$_1$, and C$_2$ and a resistor R$_0$. Compensation capacitors C$_0$ and C$_1$ are coupled between the gates of output devices M$_5$ and M$_6$, i.e., between the gate drain connection of signal device M$_7$ and node 412. In the exemplary embodiment, compensation capacitors C$_0$ and C$_1$ have approximately 3.6 pF of capacitance. A resistor R$_0$ is connected to the drain of output device M$_6$ and in between compensation capacitors C$_0$ and C$_1$. Further, another compensation capacitor C$_2$ can be coupled across the gate-drain terminals of output device M$_6$.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing bipolar or JFET devices for the various devices. In addition, one or more additional stages may be included at the input or output stages in accordance with various exemplary embodiments. Further, the various exemplary embodiments can be implemented with other types of operational amplifier circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. A low voltage amplifier configured for increased compliance, said low voltage amplifier comprising:

an input stage comprising a differential pair of transistors configured to provide a first difference signal and a second difference signal;

an output stage configured to receive at least one of said first difference signal and said second difference signal, said output stage comprising a first output device driven by a class-AB control loop and only an upper direct signal path, and a complementary, second output device driven by a lower direct signal path such that voltage changes occurring at a gate of said complementary, second output device do not significantly affect load impedance realized by said at least one of said first difference signal and said second difference signal from said output stage.

2. A low voltage amplifier configured for increased compliance, said low voltage amplifier comprising:

an input stage comprising a differential pair of transistors configured to provide a first difference signal and a second difference signal;

an output stage configured to receive at least one of said first difference signal and said second difference signal, said output stage comprising a first output device driven by a class-AB control loop and only an upper direct signal path, and a complementary, second output device driven by a lower direct signal path such that voltage changes occurring at a gate of said complementary, second output device do not significantly affect load impedance realized by said at least one of said first difference signal and said second difference signal from said output stage, wherein said class-AB control loop of said output stage further comprises:

a first biasing device, a first signal device and a second signal device, said first signal device having a gate connected to a gate of said first biasing device and a drain connected to said gate of said complementary, second output device, said second signal device having a gate connected to a control terminal of said first output device, and said first signal device and said second signal device having sources configured for receiving said second difference signal.

3. The low voltage amplifier according to claim 2, wherein said output stage further comprises:

a gain configuration comprising a second biasing device, a third signal device and a fourth signal device, said second biasing device and said third signal device having a gate connected to a gate of said fourth signal device, said third signal device and said fourth signal device having sources configured for receiving said first difference signal, and said fourth signal device having a drain connected to a gate of said first output device.

4. The low voltage amplifier according to claim 1, wherein said output stage further comprises a current mirror providing a signal path for said second difference signal from said Input stage to said output stage.

5. The low voltage amplifier according to claim 4, wherein said output stage further comprises a charge pump coupled to said mirror to facilitate compliance requirements of devices within said class-AB control loop.

6. The low voltage amplifier according to claim 3, wherein said third signal device and said fourth signal device having sources coupled to a current source configured to have increased compliance voltage during signal mode ranging between approximately 1 volt to approximately 300 mV.

7. The low voltage amplifier according to claim 1, wherein said input stage comprises a first current source coupled to sources of said differential pair of transistors.

8. The low voltage amplifier according to claim 7, wherein said amplifier comprises a charge pump coupled through said first current source to said input stage.

9. The low voltage amplifier according to claim 3, wherein said amplifier is configured with an external feedback path to provide differences in said first difference signal and said second difference signal to regulate voltage at a node coupled to said gate of said second output device.

10. The low voltage amplifier according to claim 9, wherein said differences in said first difference signal and said second difference signal are amplified by said gain configuration.

11. An output stage for use in a low voltage amplifier configured for increased compliance, said output stage comprising:

a first signal device and a second signal device configured to receive a second difference signal from an input stage, said first signal device and said second signal device configured in a class-AB control loop configuration;

a first output device driven by said class-AB control loop and a first direct signal path;

a third signal device and a fourth signal device configured to receive a first difference signal from an input stage, and a second output device complementary to said first output device, said second output device driven only by a second direct signal path without a control loop.

12. An output stage for use in a low voltage amplifier configured for increased compliance, said output stage comprising:

a first signal device and a second signal device configured to receive a second difference signal from an input stage, said first signal device and said second signal device configured in a class-AB control loop configuration:

a first output device driven by said class-AB control loop and a first direct signal path;

a third signal device and a fourth signal device configured to receive a first difference signal from an input stage, and a second output device complementary to said first output device, said second output device driven only by a second direct signal path such that said second output device operates at a low voltage during quiescent mode operation, wherein said output stage further comprises:

a first biasing transistor configured within said class-AB control loop, said first signal device having a control terminal connected to a control terminal of said first biasing transistor and an output terminal connected to said control terminal of said second output device, said second signal device having a control terminal connected to a control terminal of said first output device, and said first signal device and said second signal device having input terminals configured for receiving said second difference signal.

13. The output stage according to claim 12, wherein said output stage further comprises:

a second biasing transistor, said second biasing transistor and said third signal device having a control terminal connected to a control terminal of said fourth signal device, said third signal device and said fourth signal device having input terminals configured for receiving said first difference signal, and said third signal device having an output terminal connected to a control terminal of said first output device.

14. The output stage according to claim 13, wherein said fourth signal device having an output terminal connected to said control terminal of said second output device.

15. An operational amplifier comprising a folded cascode amplifier configured for operation at low voltages, said folded cascode amplifier comprising:

a input stage configured for receiving current from a first current source and for providing a first difference signal and a second difference signal; and an output stage comprising:

a first output device coupled to an output terminal;

a second output device coupled to said output terminal;

a class-AB control loop and a direct signal path configured for controlling said first output device; and a gain configuration for controlling said second output device without a control loop.

16. The operational amplifier according to claim 15, wherein said operational amplifier further comprises a charge pump coupled to said input stage.

17. The operational amplifier according to claim 15, wherein said input stage comprises a differential pair of transistors configured to receive a differential input voltage and to provide said first difference signal and said second difference signal.

18. An operational amplifier comprising a folded cascode amplifier configured for operation at low voltages said folded cascode amplifier comprising:
   a input stage configured for receiving current from a first current source and for providing a first difference signal and a second difference signal: and
   an output stage comprising:
   a first output device coupled to an output terminal;
   a second output device coupled to said output terminal;
   a class-AB control loop and a direct signal path configured for controlling said first output device; and
   a gain configuration for controlling said second output device to enable said second output device to operate with a low gate-source voltage,
   wherein said class-AB control loop comprises:
   a first signal device and a second signal device configured to receive said second difference signal from said input stage; and
   a first biasing transistor, said first signal device having a control terminal connected to a control terminal of said first biasing transistor and an output terminal connected to said control terminal of said second output device, said second signal device having a control terminal connected to a control terminal of said first output device, and said first signal device and said second signal device having input terminals configured for receiving said second difference signal.

19. The operational amplifier according to claim 18, wherein said gain configuration comprises:
   a third signal device and a fourth signal device configured to receive said first difference signal from said input stage; and
   a second biasing transistor, said second biasing transistor and said third signal device having a control terminal connected to a control terminal of said fourth signal device, said third signal device and said fourth signal device having input terminals configured for receiving said first difference signal, and said third signal device having an output terminal connected to a control terminal of said first output device.

20. The operational amplifier according to claim 18, wherein said output stage further comprises a current mirror configured to receive said second difference signal to provide to said first signal device and said second signal device.

* * * * *